(12) United States Patent
Dibene, II et al.

(10) Patent No.: US 6,304,450 B1
(45) Date of Patent: Oct. 16, 2001

(54) INTER-CIRCUIT ENCAPSULATED PACKAGING

(75) Inventors: Joseph Ted Dibene, II, Oceanside, CA (US); David Hartke, Durango, CO (US)

(73) Assignee: INCEP Technologies, Inc., San Diego, CA (US)

( * ) Notice: Subject to any disclaimer, the term of this patent is extended or adjusted under 35 U.S.C. 154(b) by 0 days.

(21) Appl. No.: 09/353,428

(22) Filed: Jul. 15, 1999

(51) Int. Cl.[7] ...................................................... H05K 7/20
(52) U.S. Cl. .......................... 361/704; 361/699; 361/700; 361/717; 361/718; 361/719; 257/686; 257/697; 257/706; 257/714; 257/715; 257/717; 174/15.2; 165/80.3; 165/80.4; 165/185
(58) Field of Search .......................... 361/687, 688–690, 361/694, 695, 697, 698, 699, 700, 702–704, 707, 709, 712, 713, 714, 717–721; 257/706, 717–727; 174/15.1, 15.2, 16.1, 16.3; 165/80.2, 80.3, 80.4, 104.33, 185

(56) References Cited

U.S. PATENT DOCUMENTS

| | | |
|---|---|---|
| 4,498,530 | 2/1985 | Lipschutz . |
| 4,521,829 | 6/1985 | Wessely . |
| 4,589,057 | 5/1986 | Short . |
| 4,760,495 | 7/1988 | Till . |
| 4,771,365 | 9/1988 | Cichocki et al. . |
| 4,942,497 | 7/1990 | Mine et al. . |
| 5,052,481 | 10/1991 | Horvath et al. . |
| 5,161,089 | 11/1992 | Chu et al. . |
| 5,195,020 | 3/1993 | Suzuki et al. . |
| 5,272,599 * | 12/1993 | Koenen ................................. 361/710 |
| 5,331,510 * | 7/1994 | Ouchi et al. .......................... 361/702 |
| 5,343,358 | 8/1994 | Hilbrink . |
| 5,365,402 | 11/1994 | Hatada et al. . |
| 5,390,078 * | 2/1995 | Taylor ................................... 361/721 |
| 5,396,403 | 3/1995 | Patel . |
| 5,409,055 | 4/1995 | Tanaka et al. . |
| 5,467,251 | 11/1995 | Katchmar . |
| 5,473,510 * | 12/1995 | Dozier, II ............................. 361/719 |
| 5,504,924 | 4/1996 | Ohashi et al. . |
| 5,510,958 | 4/1996 | Shimabara et al. . |
| 5,515,912 | 5/1996 | Daikoku et al. . |
| 5,619,399 * | 4/1997 | Mok ..................................... 361/707 |
| 5,621,615 * | 4/1997 | Dawson et al. ....................... 361/704 |
| 5,646,826 | 7/1997 | Katchmar . |
| 5,661,902 | 9/1997 | Katchmar . |
| 5,708,566 | 1/1998 | Hunninghaus et al. . |
| 5,729,433 * | 3/1998 | Mok ..................................... 361/704 |
| 5,734,555 * | 3/1998 | McMahon ............................ 361/704 |
| 5,761,043 | 6/1998 | Salmonson . |
| 5,794,454 | 8/1998 | Harris et al. . |
| 5,796,582 | 8/1998 | Katchmar . |
| 5,801,924 | 9/1998 | Salmonson . |
| 5,815,921 | 10/1998 | Burward-Hoy . |
| 5,825,633 | 10/1998 | Bujalski et al. . |
| 5,842,514 | 12/1998 | Zapach et al. . |
| 5,856,911 | 1/1999 | Riley . |
| 5,898,573 | 4/1999 | Fugaro . |
| 5,920,458 | 7/1999 | Azar . |
| 5,930,115 * | 7/1999 | Tracy et al. .......................... 361/704 |
| 5,986,887 | 11/1999 | Smith et al. . |
| 5,995,370 | 11/1999 | Nakamori . |

FOREIGN PATENT DOCUMENTS

| | | |
|---|---|---|
| 0 582 145 | 2/1994 | (EP) . |
| 0 717 443 A1 | 6/1996 | (EP) . |
| 0 920 055 A2 | 6/1999 | (EP) . |
| 11-074427 | 3/1999 | (JP) . |
| WO 96/23397 | 8/1996 | (WO) . |

* cited by examiner

Primary Examiner—Leo P. Picard
Assistant Examiner—Boris Chervinsky
(74) Attorney, Agent, or Firm—Gates & Cooper LLP

(57) ABSTRACT

An encapsulated circuit assembly and a method for making an encapsulated circuit assembly are disclosed. The assembly comprises a first printed circuit board, a second printed circuit board, and a heat transfer device. The second printed circuit board comprises a heatsink, and the heat transfer device couples between a device mounted on the first printed circuit board and the second printed circuit board for transferring heat from the device to the heatsink of the second printed circuit board.

14 Claims, 13 Drawing Sheets

Section A-A

Plan View

INTER-CIRCUIT ENCAPSULATED PACKAGING

BACKGROUND OF THE INVENTION

1. Field of the Invention

This invention relates in general to a methodology to improve thermal and mechanical issues created by increased interconnect density, increased power levels by electronic circuits and increased levels of integrated electronic packaging. The present invention addresses these issues by encapsulating the circuitry within a circuit board structure which improves thermal, mechanical and integrated circuit device management over existing technologies known in the art today.

2. Description of Related Art

As circuitry in electronics becomes more and more complex, packaging of the circuitry has become more difficult. The common method for packaging integrated circuits and other electronic components is to mount them on Printed Circuit Boards (PCBs).

Recently, the application of new organic laminates in the construction of Multi-Chip-Modules (MCMs) has brought about significant improvements in the packaging cost and density of electronic circuits. Throughout this patent reference will be made to PCBs which shall be meant to include technologies associated with MCMs as well.

Computer chip clocking speeds have also increased. This increase in speed has made it difficult to couple chips together in such a way that the chip speeds are completely useable. Further, heat generated by integrated circuits has increased because of the increased number of signals travelling through the integrated circuits. In addition, as die size increases interconnect delays on the die are beginning to limit the circuit speeds within the die. Typically, the limitations of a system are contributed to, in part, by the packaging of the system itself. These effects are forcing greater attention to methods of efficiently coupling high-speed circuits.

Packaging the integrated circuits onto PCBs has become increasingly more difficult because of the signal density within integrated circuits and the requirements of heat dissipation. Typical interconnections on a PCB are made using traces that are etched or pattern plated onto a layer of the PCB. To create shorter interconnections, Surface Mount Technology (SMT) chips, Very Large Scale Integration (VLSI) circuits, flip chip bonding, Application Specific Integrated Circuits (ASICs), Ball Grid Arrays (BGAs), and the like, have been used to shorten the transit time and interconnection lengths between chips on a PCB. However, this technology has also not completely overcome the needs for higher signal speeds both intra-PCB and inter-PCB, because of thermal considerations, EMI concerns, and other packaging problems.

In any given system, PCB area (also known as PCB "real estate") is at a premium. With smaller packaging envelopes becoming the norm in electronics, e.g., laptop computers, spacecraft, cellular telephones, etc., large PCBs are not available for use to mount SMT chips, BGAs, flip chips or other devices. Newer methods are emerging to decrease the size of PCBs such as Build-Up-Multilayer technology, improved organic laminate materials with reduced thicknesses and dielectric constants and laser beam photo imaging. These technologies produce greater pressure to maintain the functionality of the PCB assembly in thermal, EMI and power application to the semiconductor devices. It can be seen, then, that there is a need in the art for a method for decreasing the size of PCBs while maintaining the functionality of PCBs. Further, there is a need for reducing the size of PCBs while using present-day manufacturing techniques to maintain low cost packaging.

SUMMARY OF THE INVENTION

To overcome the limitations in the prior art described above, and to overcome other limitations that will become apparent upon reading and understanding the present specification, the present invention discloses an encapsulated circuit assembly which utilizes printed circuit boards as a foundation for the assembly structure. The assembly comprises a first printed circuit board, a second printed circuit board, and a heat transfer device. The second printed circuit board comprises a thermal heatsink or secondary heat transfer mechanism such as a heat pipe and heat transfer devices imbedded within the second printed circuit board which thermally couples devices mounted on the first printed circuit board and the thermal heat sink of the second printed circuit board.

An object of the present invention is to provide more efficient usage of printed circuit board real estate. Another object of the present invention is to increase the density of electronics on printed circuit boards. Another object of the present invention is to provide heat transfer from devices on printed circuit boards.

These and various other advantages and features of novelty that characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of a method, apparatus, and article of manufacture in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to he accompanying drawings which form a part hereof, and in which is shown byway of illustration a specific embodiment in which the invention may be practiced. It is to be understood that other embodiments may be utilized and structural changes may be made without departing from the scope of the present invention.

Overview

The present invention discloses an encapsulated circuit assembly and a method for making such an assembly. The assembly comprises a first printed circuit board, a second printed circuit board, and heat transfer devices. The second printed circuit board comprises a heatsink or secondary heat transfer mechanism such as heat pipes and heat transfer devices imbedded within the second printed circuit board which thermally couples devices mounted on the first printed circuit board and the thermal heat sink of the second printed circuit board.

The present invention provides a method and apparatus for mounting integrated circuit devices onto PCBs that removes the heat from those devices that generate large amounts of heat, The present invention allows for air cooling, heat pipe cooling, or other methods of cooling devices, as well as a compact packing design to allow for heat generating devices to be packaged into small volumes. Furthermore, the present invention can be expanded to provide beneficial aspects to the art of power distribution, containment of electromagnetic interference and electronic signal interconnect.

Encapsulated Circuit Assembly

Figure 1A:
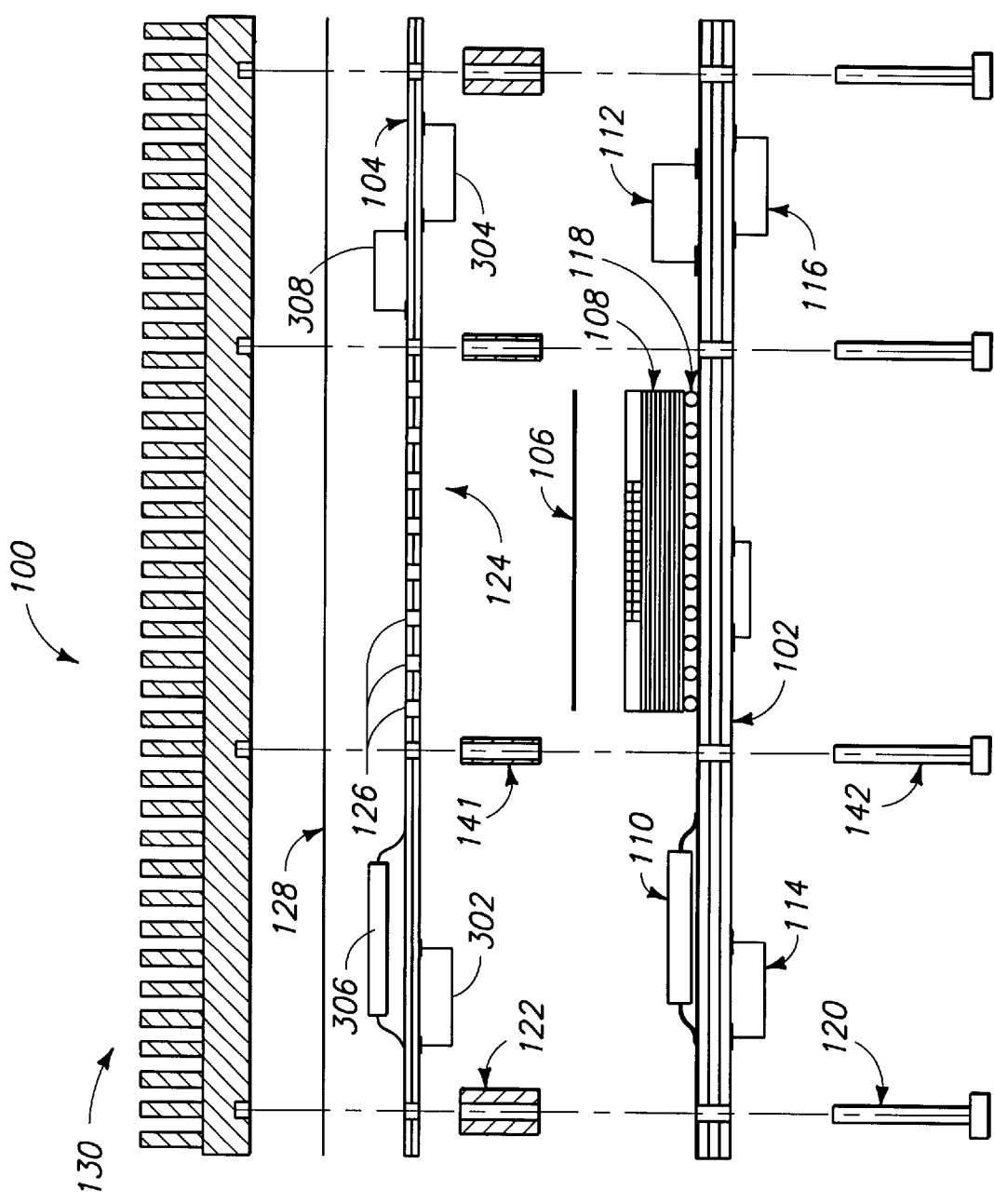
FIGS. 1A–1D illustrate the construction of a printed circuit board assembly using the present invention.
Figure 1B:
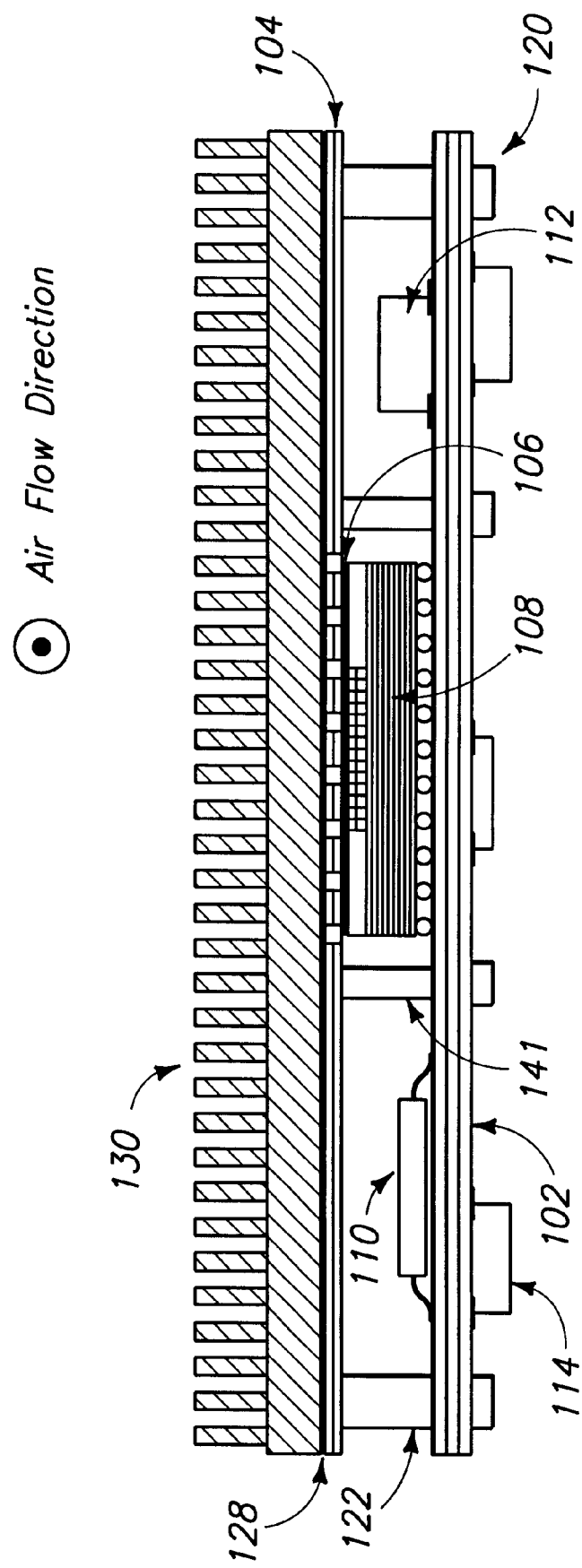
Figure 1C:
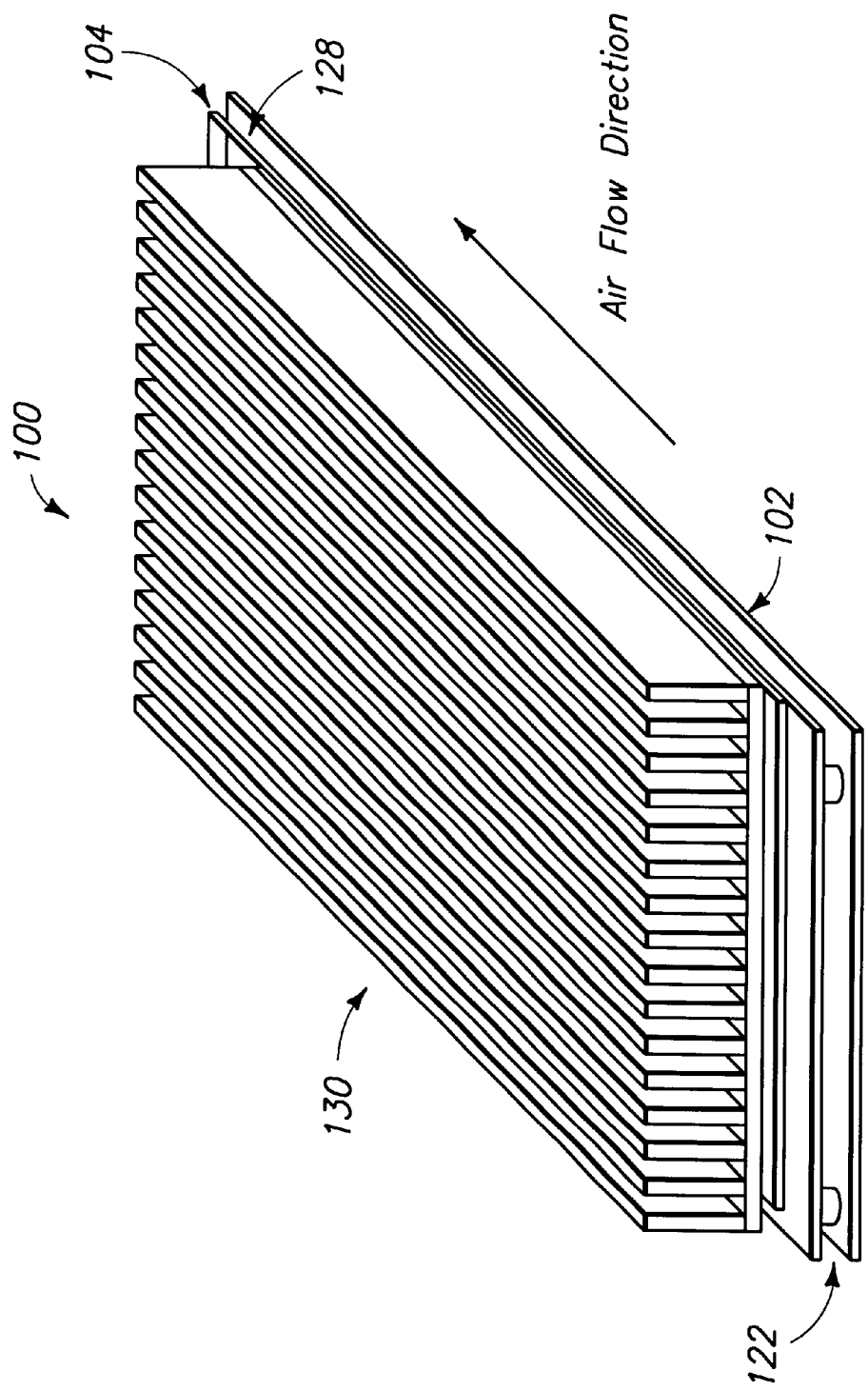

FIGS. 1A–1C illustrate the construction of an encapsulated circuit assembly using the present invention. FIG. 1A illustrates an exploded view of assembly 100. Assembly 100 comprises first printed circuit board (PCB) 102, second PCB 104, and heat transfer device 106. First PCB 102 can be a single layer PCB or multi-layer PCB, where the multi-layer PCB is comprised of alternating layers of conducting and non-conducting materials to allow electrical signals to be routed from device to device on the first PCB 102. Devices 108–116 are shown mounted on first PCB 102. Devices 114 and 116 are shown as being mounted on the opposite side of first PCB 102 as devices 108–112. This illustrates that first PCB 102 can have devices 108–116 mounted on both sides.

Device 108 is coupled to first PCB 102 via a Ball Grid Array (BGA) 118. BGA 118 provides electrical contacts between device 108 and first PCB 102. Other methods of electrical coupling between device 108 and first PCB 102 are possible, e.g., wire bonding, solder connections, etc. Further, there can also be thermal coupling between device 108 and PCB 102 if desired.

Heat transfer device 106 couples device 108 to second PCB 104. Heat transfer device 106 is typically a thermally conductive material, e.g., thermal grease, thermal epoxy, or a commercially produced material such as THERMA-GAP™. Heat transfer device 106 provides a thermal interface between device 108 and the second PCB 104. Heat transfer device 106 is typically a mechanically compliant material to allow for minimal applied pressure to the device 108 such that device 108 is not subjected to additional stress through use of heat transfer device 108.

Spacers 141 and fasteners 142 provide for a precision alignment between boards 102 and 104 and the device 108 such that a controlled gap exists in which heat transfer device 106 can properly be accommodated without deleterious air gaps nor excessive pressure applied to device 108. Additionally, the location of the spacers 141 adjacent to the device 108 reduce variations in spacing caused by bow and warpage of board 102 and, to some extent, board 104.

Devices 110–116 that are thermally active but do not require heat transfer device 106 to cool the devices 110–116 and are cooled by conduction through first PCB 102, or through convection should air flow be available across first PCB 102. Otherwise, additional devices 110–116 can be coupled to second PCB 104 through additional heat transfer devices 106. The present invention is not limited to a single device 108 that is cooled through the use of heat transfer device 106. Any number of devices 108–116 can be cooled through the use of single or multiple heat transfer devices 106.

Second PCB 104 is mechanicaly coupled to first PCB 102 through the use of fasteners 120 and standoffs 122. Fasteners 120 are typically screws, but can be other types of fasteners such as rivets, hollow feedthroughs, connectors, or other fasteners. Standoffs 122 are typically unthreaded inserts with a height equal to the height of spacer 141. The fasteners 120 and standoffs 122 are located at mechanically and/or electrically desirable locations on first PCB 102. These locations are typically at the periphery of first PCB 102, but can be anywhere on first PCB 102.

Second PCB 104 has areas 124 that are designed to facilitate the transfer of heat from device 108, through heat transfer device 106, to a heat sink. Areas 124 comprise plated through holes (PTHs) 126, consisting of holes in board 104 with interior walls of plated copper or other high thermally conductive material. In addition, the region within the hole may be filled with metal, liquid filled areas, or other thermal transfer devices or mechanisms to enhance thermal conduction between the material 106 and the heatsink 130. Areas 124 can be designed to be the same size, a larger size, or a smaller size than the device 108, depending on the heat dissipation requirements for device 108 and the size of second PCB 104. An additional benefit of PTHs 126 is to provide a means of reducing air pockets in material 106 and to provide a volume where excesses of material 106 may flow in the case of a reduced gap between device 108 and board 104. Still another benefit of PTHs 126 can be to adjust the thermal conductivity of the paths of multiple devices 108 on a single first PCB 102 to the common "isothermal" heatsink 130 such that if the two devices 108 have differing heat flow then the conductivity in each thermal path can be adjusted such that the junction temperature of each device 108 will be the same. This can be beneficial in improving timing margins of digital devices.

A thermal interface such as a plate 128 is coupled to second PCB 104 to equalize and transfer heat from device 108, through heat transfer device 106 and second PCB 104 area 124 to heat sink 130. Although shown as a finned heat sink, heatsink 130 can be any device, e.g., a heat pipe, or a layer on second PCB 104 that acts as an isothermal conduction layer to properly remove the heat generated by device 108. Thermal interface 128 can be electrically conductive, or non-electrically conductive, depending on the design for second PCB 104. For example, if devices 302–308 need to be mounted on second PCB 104, thermal interface 128 should be electrically non-conductive so as not to interfere with signals travelling between devices 108–116 that are mounted on second PCB 104. Thermal interface 128 can be they epoxy or any other material which thermally and mechanically bonds second PCB 104 to heatsink 130.

FIG. 1B illustrates the assembly 100 as a completed assembly. The thermal coupling of device 108, heat transfer device 106, second PCB 104 in conjunction with PTHs 126, thermal interface 128, and heatsink 130 provide a thermal path for heat generated by device 108 to be dissipated by heatsink 130. Further, airflow can be provided to further cool device 108 and devices 110–116. Although shown as covering the entire area of second PCB 104, heatsink 130 can be larger or smaller than the area of second PCB 104. Heatsink 130 also acts as a mechanical stabilizer for assembly 100, to provide additional mechanical stability for assemblies 100 that will experience more severe mechanical environments, e.g., vibration.

FIG. 1C illustrates assembly 100 in an isometric view. Heatsink 130 is shown as smaller than second PCB 104 and thermal interface 128 to illustrate the flexibility of the design of the present invention. Airflow can again be provided to increase the heat dissipation capabilties of assembly 100.

Figure 1D:
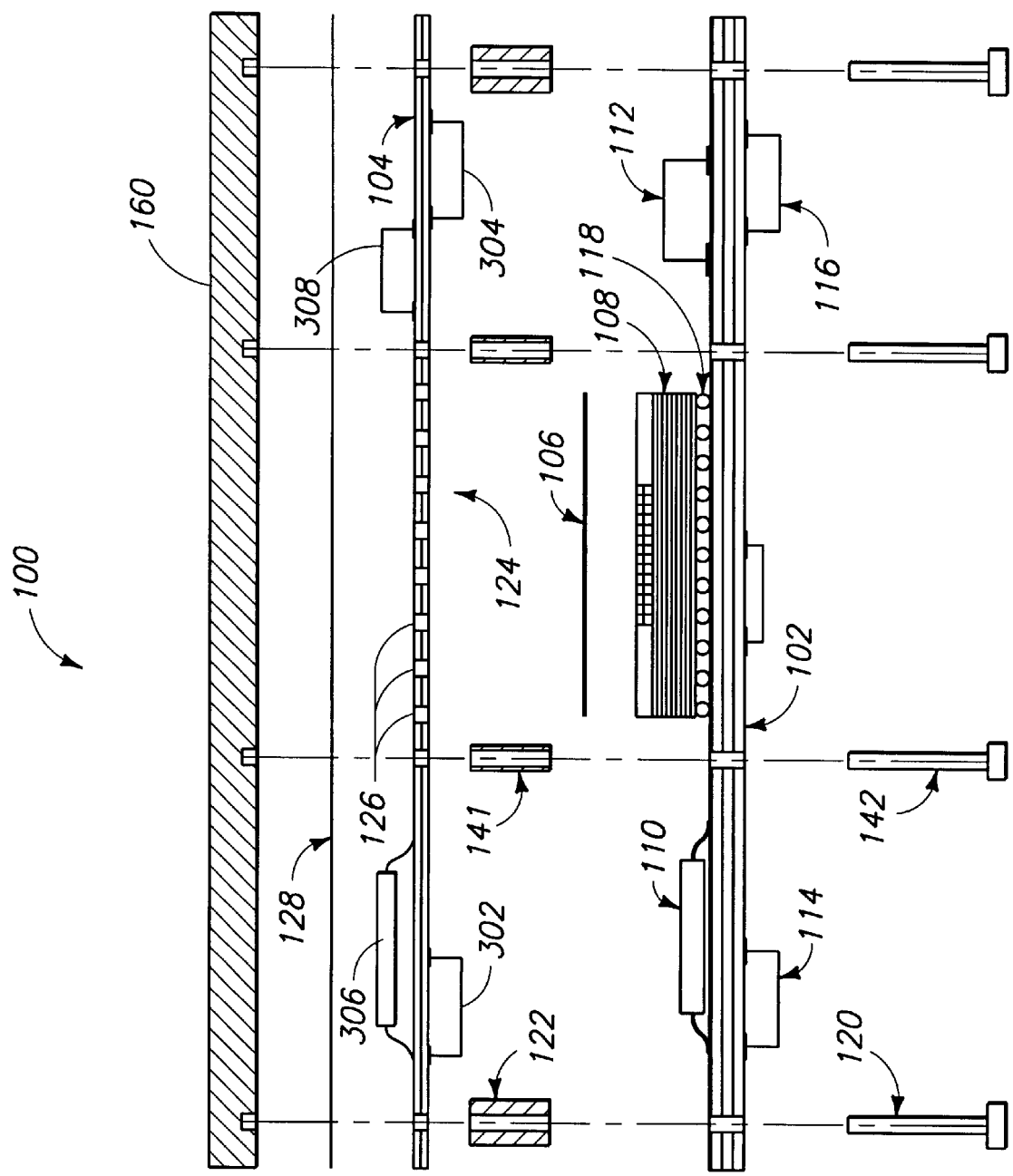

FIG. 1D illustrates an embodiment of the assembly 100 comprising a heat pipe 160.

Multiple Device Encapsulated Circuit Assembly

Figure 2A:
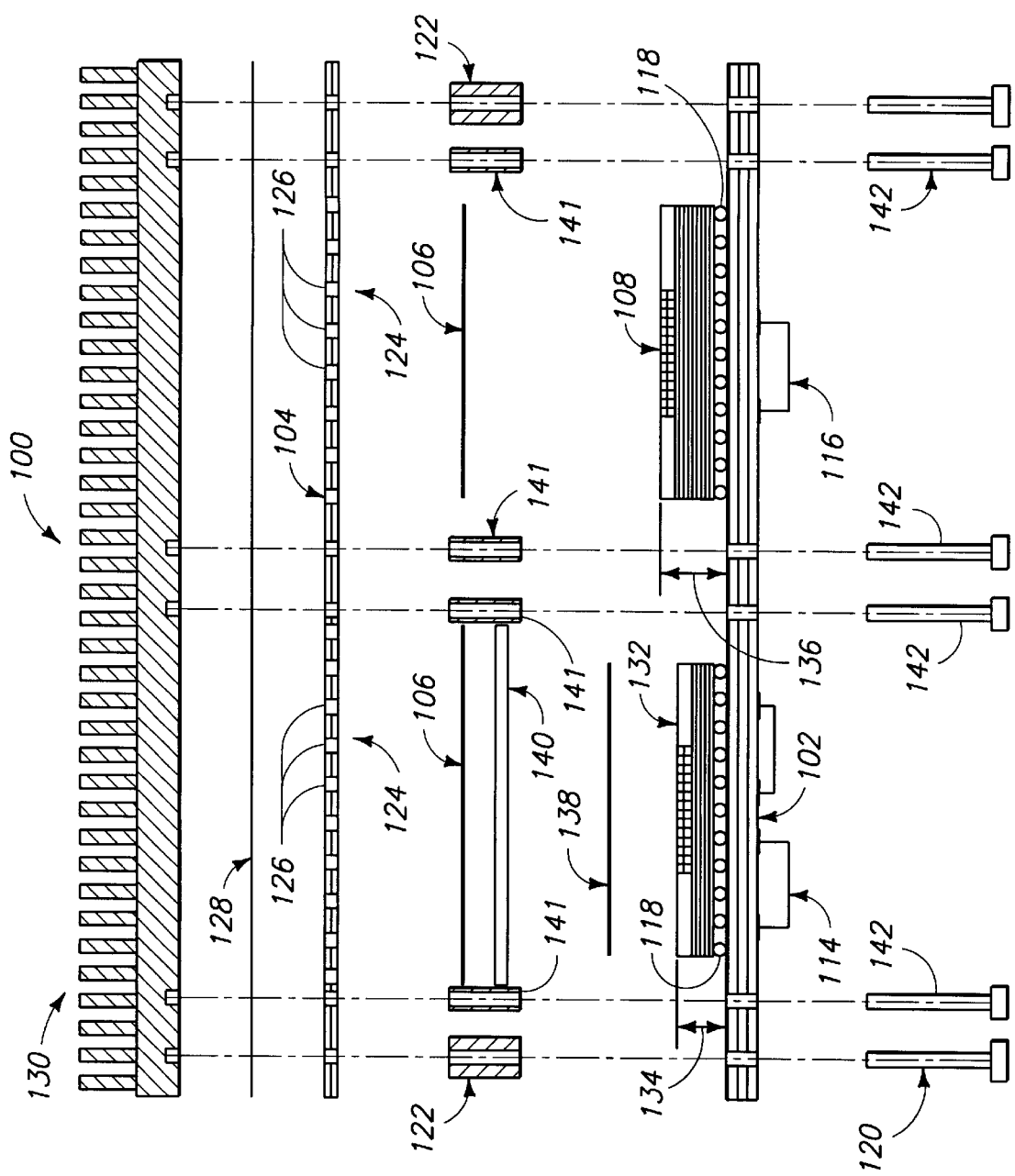
FIGS. 2A–2B illustrates the construction of a printed circuit board assembly using the present invention for multiple heat generating integrated circuit devices.
Figure 2B:
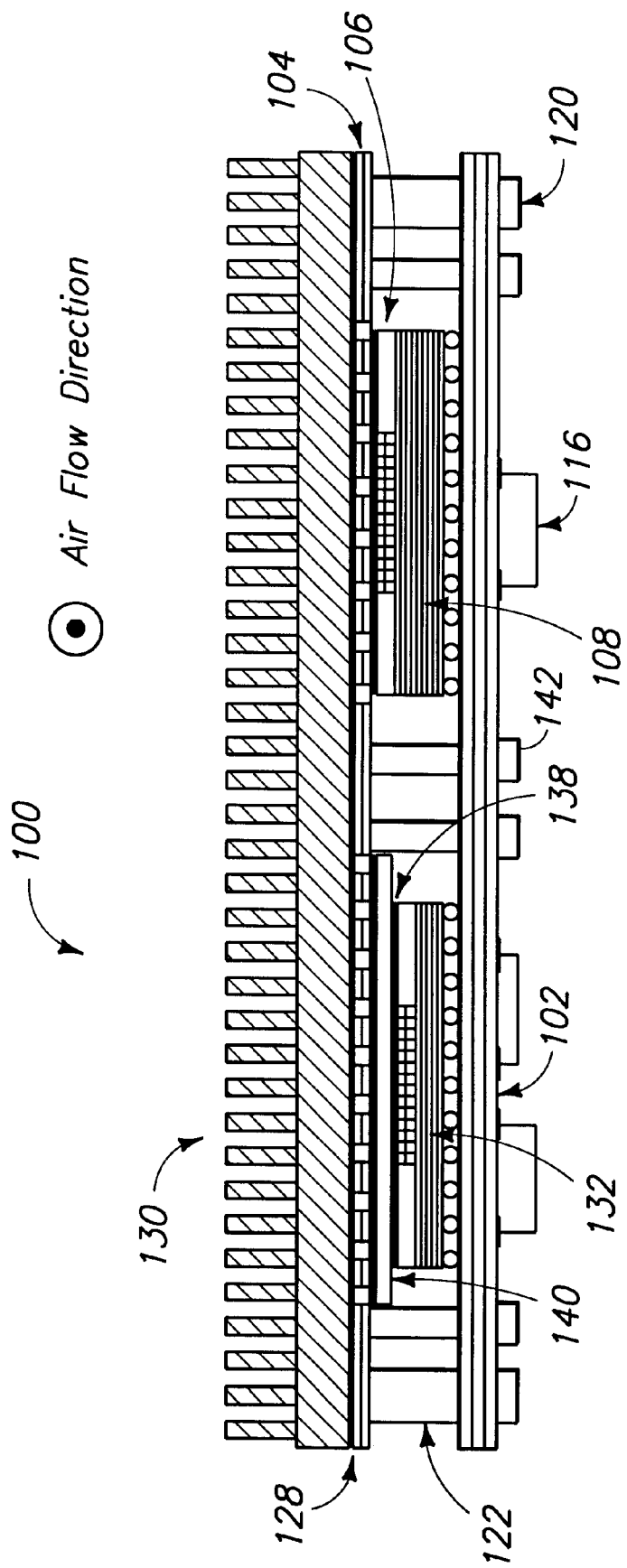

FIGS. 2A–2B illustrate the construction of an encapsulated circuit assembly using the present invention for multiple heat generating integrated circuit devices. FIG. 2A illustrates an exploded view of assembly 100. Assembly 100 comprises first printed circuit board (PCB) 102, second PCB 104, and heat transfer device 106. First PCB 102 can be a single layer PCB or multi-layer PCB, where the multi-layer PCB is comprised of alternating layers of conducting and non-conducting materials to allow electrical signals to be routed from device to device on the first PCB 102. Devices 108, 114–116, and 132 are shown mounted on first PCB 102. Devices 114 and 116 are shown as being mounted on the opposite side of first PCB 102 as devices 108 and 132. This illustrates that first PCB 102 can have devices 108, 114–116, and 132 mounted on both sides.

Devices 108 and 132 are coupled to first PCB 102 via a Ball Grid Array (BGA) 118. BGA 118 provides electrical contacts between devices 108 and 132 and first PCB 102. Other methods of electrical coupling between devices 108 and 132 and first PCB 102 are possible, e.g., Tape Automated Bonding (TAB), SMT, flip chip, etc. Further, there can also be thermal coupling between devices 108 and 132 and PCB 102 if desired.

Heat transfer device 106 couples device 108 to second PCB 104. Heat transfer device 106 is typically a thermally conductive material, e.g., thermal grease, thermal epoxy, or a commercially produced material such as THERMA-GAP™. Heat transfer device 106 provides a thermal interface between device 108 and the second PCB 104. Heat transfer device 106 is typically a mechanically compliant material to allow for minimal applied pressure to the device 108 such that device 108 is not subjected to additional stress through use of heat transfer device 108.

Spacers 141 and fasteners 142 provide for a precision alignment between boards 102 and 104 and the device 108 such that a controlled gap exists in which heat transfer device 106 can properly be accommodated without deleterious air gaps nor excessive pressure applied to device 108. Additionally, the location of the spacers 141 adjacent to the device 108 reduce variations in spacing caused by bow and warpage of board 102 and, to some extent, board 104.

Devices 114–116 that are thermal active but do not require heat transfer device 106 to cool the devices 114–116 are cooled by conduction through first PCB 102, or through convection should air flow be available across first PCB 102.

Device 132 is another heat generating device similar to device 108. However, all devices 108 and 132 that will require additional cooling through heat transfer device 106, second PCB 104, and heatsink 130 are not the same size and/or height. Therefore, each device 108 and 132 must be treated individually using the present invention to best provide heat dissipation for each device 108 and 132. In FIG. 2A, device 132 is shown as having a height 134 smaller than height 136 of device 108. There can be many devices 108 and 132 of varying heights mounted on first PCB 102, all of which can be cooled by the assembly 100 of the present invention, through use of an additional thermal interface 138 and a thermal conductive spacer 140.

Thermal interface 138 provides a thermal path for device 132 that will allow heat generated by device 132 to be dissipated by heatsink 130. Thermal interface 138 can be similar to heat transfer device 106, but can also be a different thermal transfer material to provide a proper thermal dissipative path. As an example thermal interface 138 need not be mechanically compliant so long as thermal interface 106 above it is. Thus, the use of a hardening thermal epoxy may be useful to hold spacer 140 in place during assembly.

Spacer 140 is provided to increase height 134 to approximate height 136. This allows device 108 and device 132 to contact heat transfer device 106, which in turn contacts second PCB 104 and heatsink 130 to transfer heat from devices 108 and 132 to heatsink 130. Spacer 140 is shown as larger in size than device 132, which can provide for heat spreading of the heat generated by device 132 to heatsink 130. Spacer 140 can be of any size relative to device 132. Further, there can be spacers 140 on more than one device 108 and 132.

Where height differences between devices are relatively small and power levels modest these height differences may beneficially be accommmodated by selecting varying thicknesses of heat transfer device 106 rather than utilizing thermal interface 138 and spacer 140.

Second PCB 104 is coupled mechanically to first PCB 102 through the use of fasteners 120 and standoffs 122. Fasteners 120 are typically screws, but can be other types of fasteners such as rivets, feedthroughs that are hollow, connectors, or other fasteners. Standoffs 122 are typically unthreaded inserts with a height equal to the height of spacer 141. The fasteners 120 and standoffs 122 are located at mechanically and/or electrically desirable locations on first PCB 102. These locations are typically at the periphery of first PCB 102, but can be anywhere on first PCB 102. Second PCB 104 has areas 124 that are designed to facilitate the transfer of heat from devices 108 and 132, through heat transfer device 106, to a heat sink. Areas 124 comprise plated through holes (PTHs) 126, consisting of holes in board 104 with interior was of plated copper or other high thermally conductive material. In addition, the region within the hole may be filled with metal, liquid filled areas, or other thermal transfer devices or mechanisms to enhance thermal conduction between material 106 and heatsink 130. Areas 124 can be designed to be the same size, a larger size, or a smaller size than the device 108, depending on the heat dissipation requirements for device 108 and the size of second PCB 104. An additional benefit of PTHs 126 is to provide a means of reducing air pockets in material 106 and to provide a volume where excesses of material 106 may flow in the case of a reduced gap between device 108 and 104.

Thermal interface 128 is coupled to second PCB 104 to equalize and transfer heat from device 108, through heat transfer device 106 and second PCB 104 area 124 to heat sink 130. Although shown as a finned heat sink, heatsink 130 can be any device, e.g., a heat pipe, or a layer on second PCB 104 that acts as an isothermal conduction layer to properly remove the heat generated by device 108. Thermal interface 128 can be electrically conductive, or non-electrically conductive, depending on the design for second PCB 104. For example, if devices 108–116 need to be mounted on second PCB 104, thermal interface 128 can be electrically non-conductive so as not to interfere with signals travelling between devices 108–116 that are mounted on second PCB 104. Thermal interface 128 can be thermal epoxy or any other material which thermally and mechanically bonds board 104 to heatsink 130.

FIG. 2B illustrates the assembly 100 of FIG. 2A as a completed assembly. The thermal coupling of devices 108 and 132, heat transfer device 106, thermal interface 138, spacer 140, second PCB 104 in conjunction with PTHs 126, thermal interface 128, and heatsink 130 provide thermal paths for heat generated by devices 108 and 132 to be dissipated by heatsink 130. Further, airflow can be provided to further cool devices 108 and 132, as well as devices 110–116. Although shown as covering the entire area of second PCB 104, heatsink 130 can be larger or smaller than the area of second PCB 104. Heatsink 130 also acts as a mechanical stabilizer for assembly 100, to provide additional mechanical stability for assemblies 100 that will experience more severe mechanical environments, e.g., vibration.

Figure 3A:
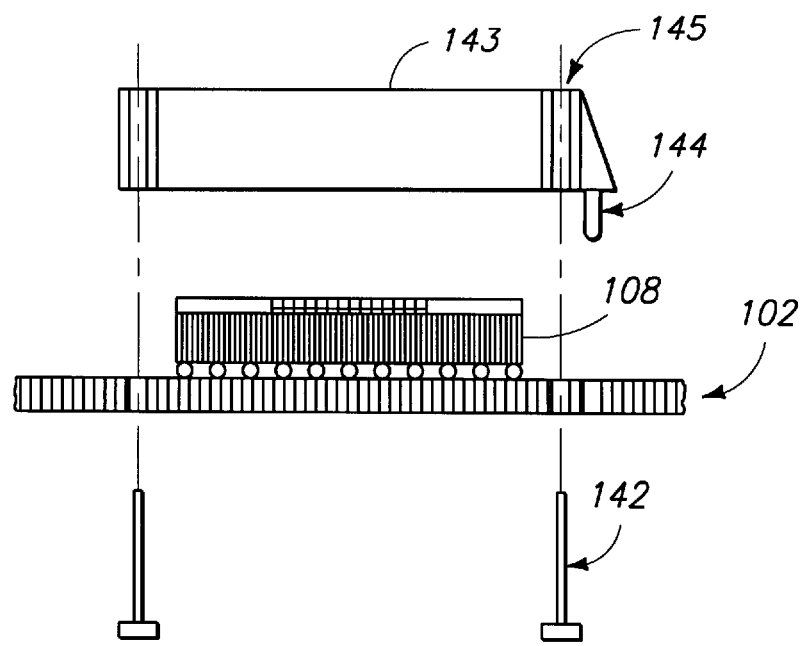
FIGS. 3A–3B illustrate spacers which are used in conjunction with the present invention.
Figure 3A:
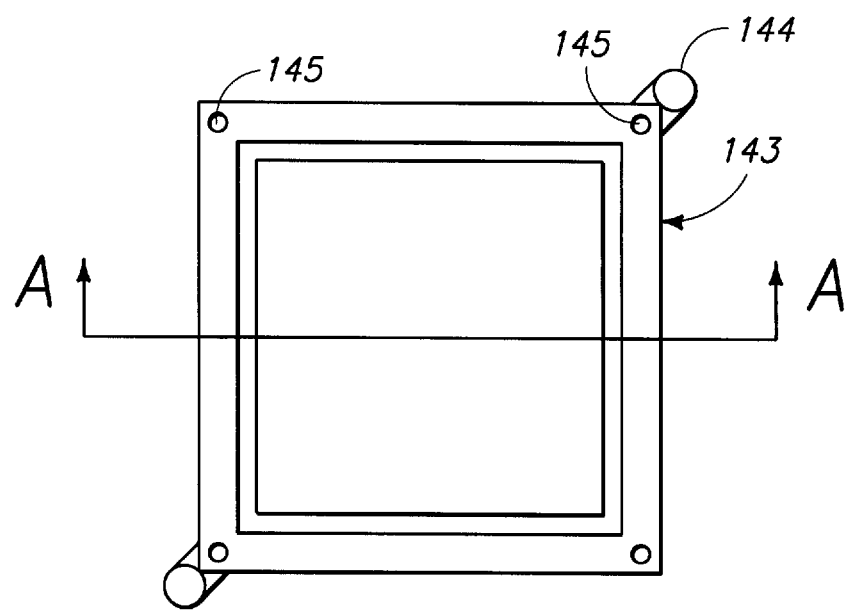

FIG. 3A illustrates in plan and section views a molded plastic spacer 143 that may be used in place of spacers 141 around a device that must be thermally coupled to board 104. This spacer has clearance holes 145 for fasteners 142. Although spacer 143 is shown with four clearance holes 145, spacer 143 can have any number of clearance holes 145 without departing from the scope of the present invention. Imbedded metal spacers may be molded into holes 145 where it may be desirous to provide electrical contact between board 102 and board 104. Spacer 143 substantially surrounds device 108, but can take any shape desired. A feature of the spacer is pins 144 that engage in mating holes of board 102 and act to hold spacer 143 in place until final assembly of assembly 100. An additional benefit of spacer 143 is that it provides complete enclosure of device 108 to prevent accidental damage. Furthermore, spacer 143 may be used to provide thermal isolation between device 108 and the remainder of the board assembly 100.

Figure 3B:
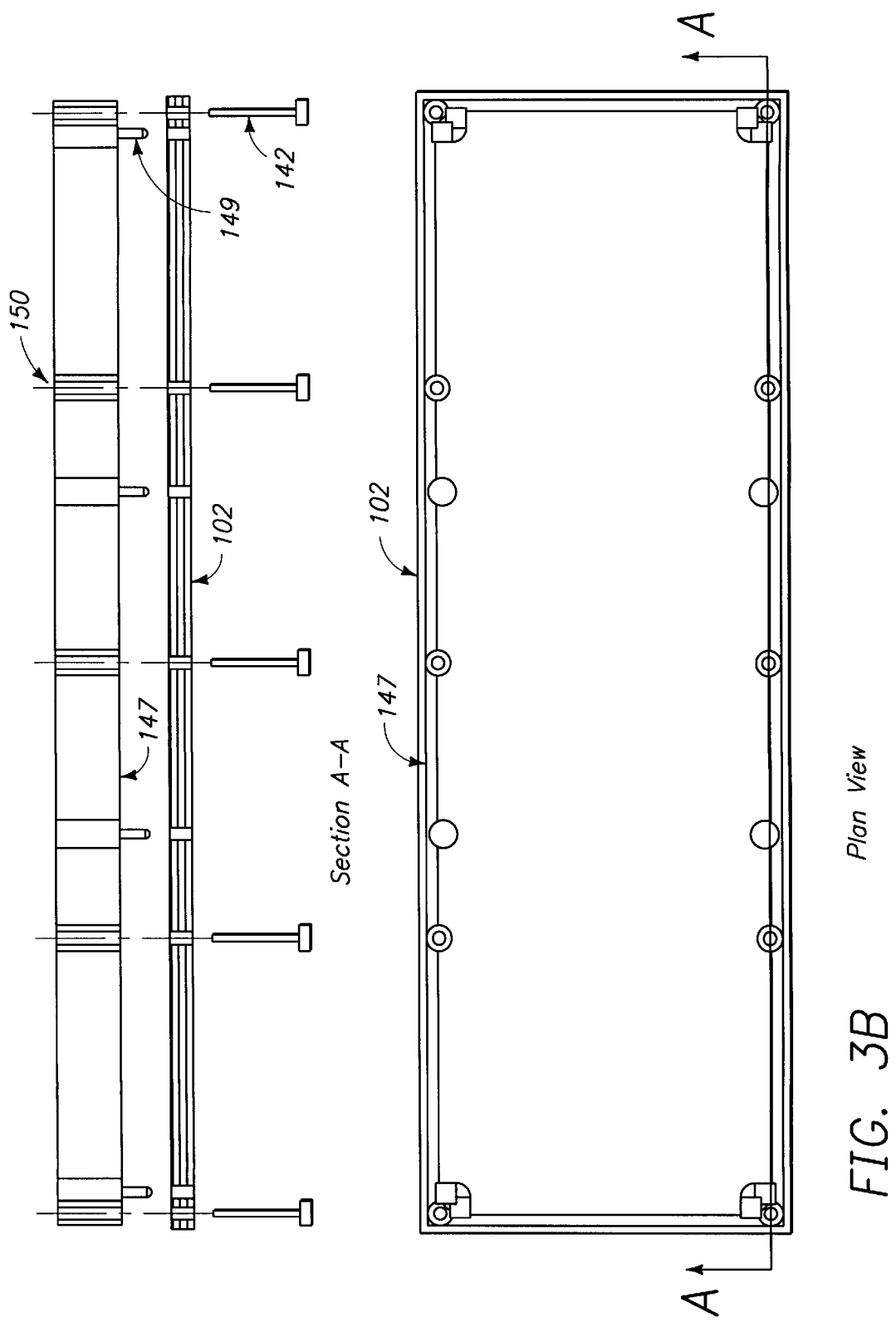

FIG. 3B illustrates a molded plastic spacer 147 that may be used in place of spacers 141 which have been previously described as used to couple second PCB 104 to first PCB 102. This spacer 147 is shown as having ten clearance holes 150 for fasteners 120, however a larger or smaller number of fasteners may be used as the need and size of the PCBs 102 and 104 require. Imbedded metal spacers may be molded into holes 150 where it may be desirous to provide electrical contact between board 102 and board 104. Furthermore, the entire molded assembly may be formed as a cast metal structure or other metallic form which may be useful in the containment of electromagnetic radiation. A feature of the spacer 147 is pins 149 that engage in mating holes of board 102 and act to hold in place spacer 147 until final assembly of 100. An additional benefit of spacer 147 is that it provides complete enclosure of device 108 to prevent accidental damage. Furthermore, spacer 147 may be used to provide environmental isolation to the internal components of assembly 100.

Embodiments Of The Present Invention

Figure 4A:
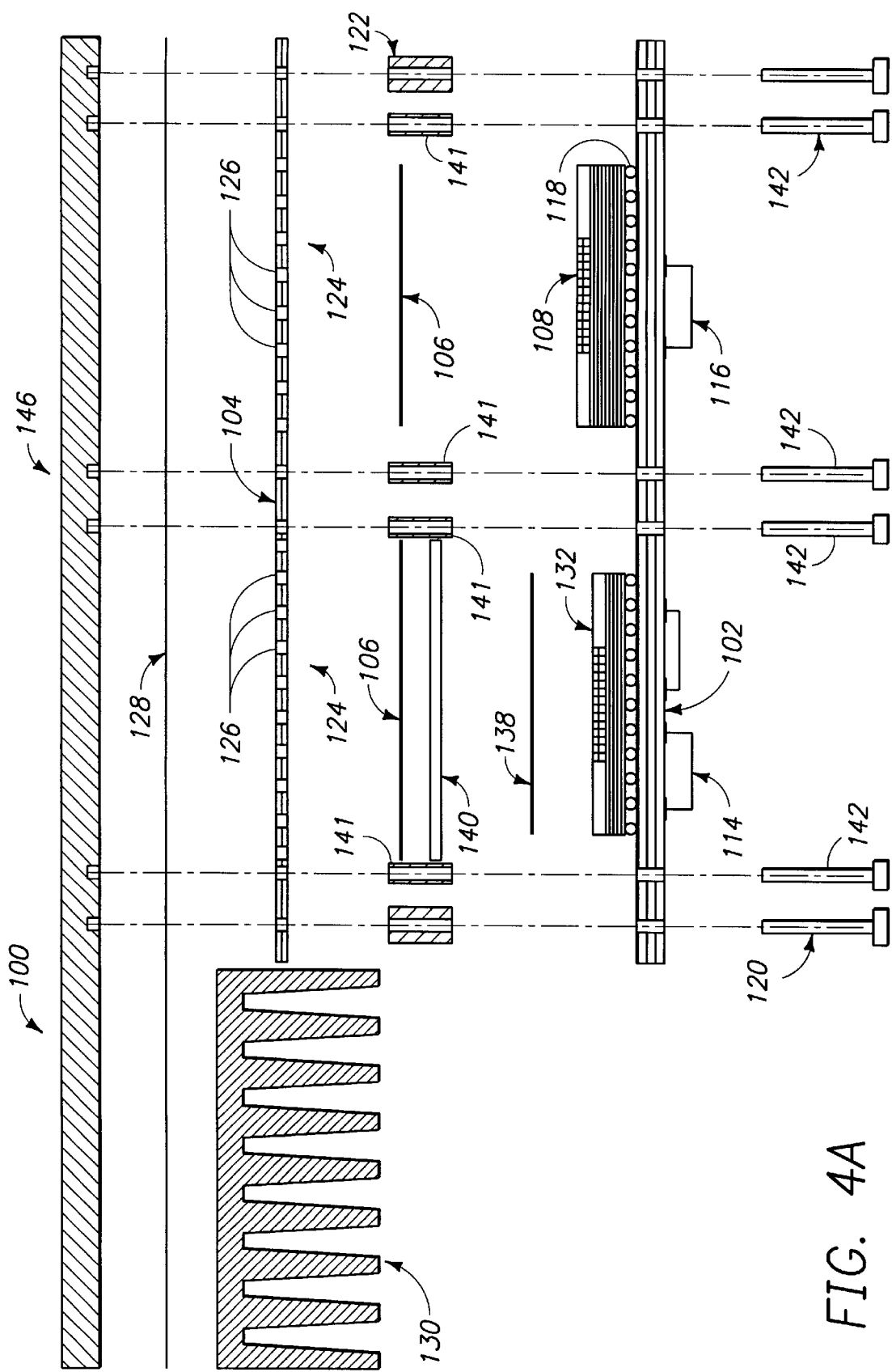
FIGS. 4A–4C illustrate the construction of a printed circuit board using the present invention wherein the thermal heat sink is located outboard the active circuit area.
Figure 4B:
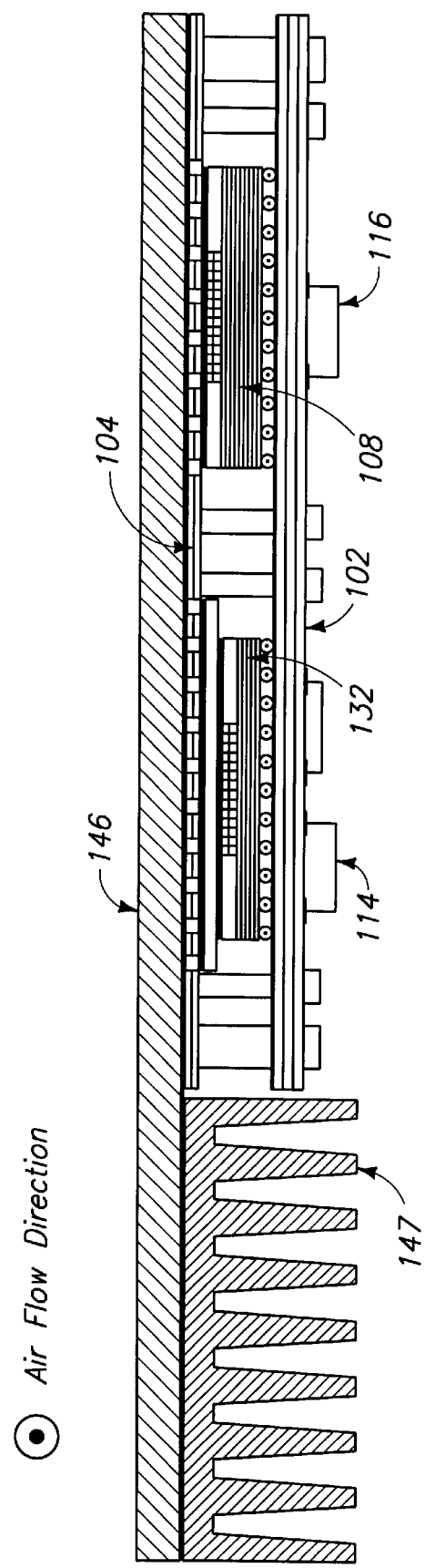
Figure 4C:
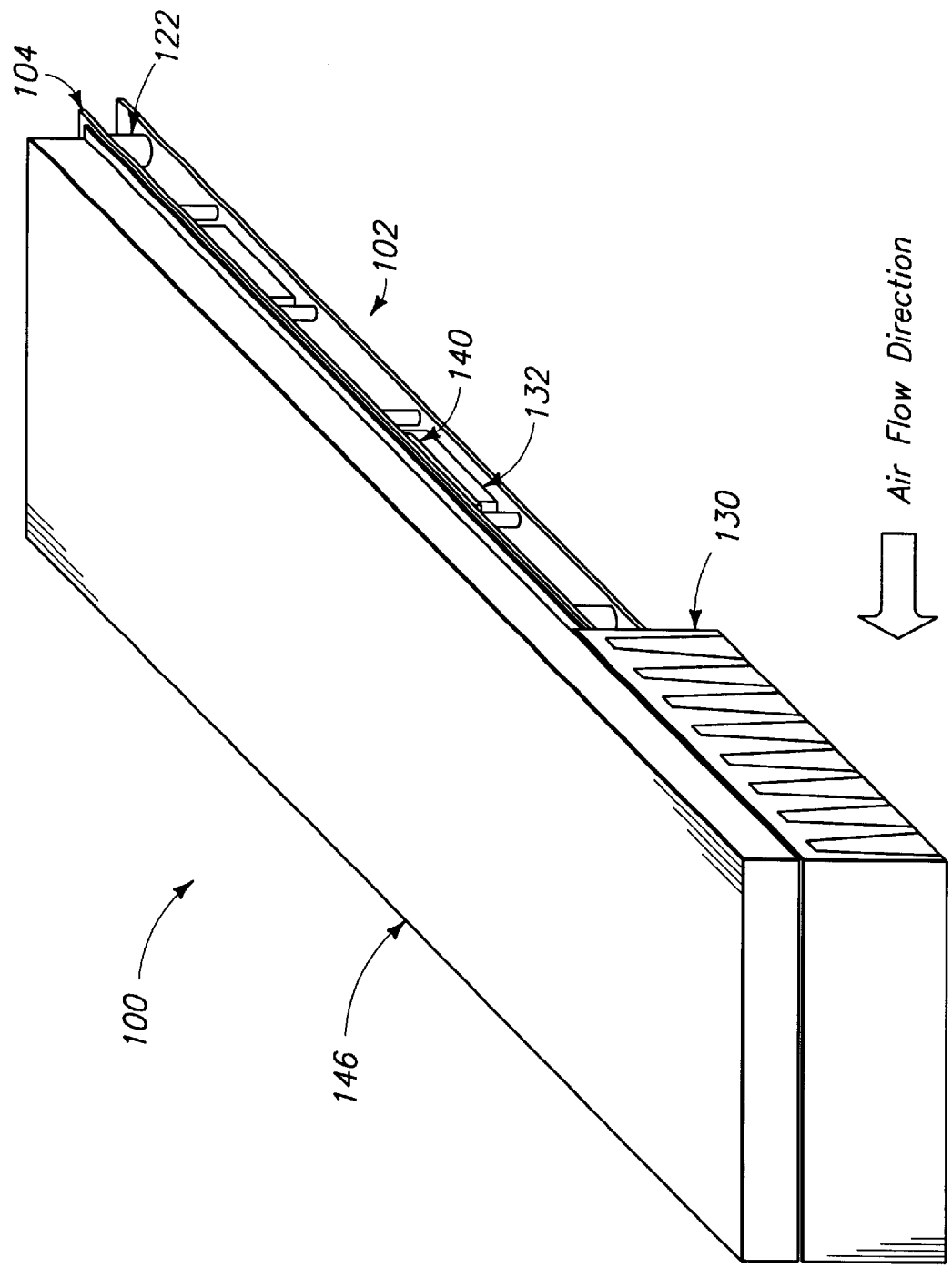

FIGS. 4A–4C illustrate the construction of a printed circuit board using the present invention. FIG. 4A illustrates an exploded view of assembly 100. Assembly 100 comprises first printed circuit board (PCB) 102, second PCB 104, and heat transfer device 106. First PCB 102 can be a single layer PCB or multi-layer PCB, where the multi-layer PCB is comprised of alternating layers of conducting and non-conducting materials to allow electrical signals to be routed from device to device on the first PCB 102. Devices 108, 114, and 116 are shown mounted on first PCB 102. Devices 114 and 116 are shown as being mounted on the opposite side of first PCB 102 as device 108. This illustrates that first PCB 102 can have devices 108, 114, and 116 mounted on both sides.

Device 108 is coupled to first PCB 102 via a Ball Grid Array (BGA) 118. BGA 118 provides electrical contacts between device 108 and first PCB 102. Other methods of electrical coupling between device 108 and first PCB 102 are possible, e.g., wire bonding, solder connections, etc. Further, there can also be thermal coupling between device 108 and PCB 102 if desired.

Heat transfer device 106 couples device 108 to second PCB 104. Heat transfer device 106 is typically a thermally conductive material, e.g., thermal grease, thermal epoxy, or a commercially produced material such as THERMA-GAP™. Heat transfer device 106 provides a thermal interface between device 108 and the second PCB 104. Heat transfer device 106 is typically a mechanically compliant material to allow for minimal applied pressure to the device 108 such that device 108 is not subjected to additional stress through use of heat transfer device 108.

Spacers 141 and fasteners 142 provide for a precision alignment between boards 102 and 104 and the device 108 such that a controlled gap exists in which heat transfer device 106 can properly be accommodated without deleterious air gaps nor excessive pressure applied to device 108. Additionally, the location of the spacers 141 adjacent to the device 108 reduce variations in spacing caused by bow and warpage of board 102 and, to some extent, board 104.

Devices 114–116 that are thermally active but do not require heat transfer device 106 to cool the devices 114–116 are cooled by conduction through first PCB 102, or through convection should air flow be available across first PCB 102. Otherwise, additional devices 114–116 can be coupled to second PCB 104 through additional heat transfer devices 106. The present invention is not limited to a single device 108 that is cooled through the use of heat transfer device 106. Any number of devices 108 can be cooled through the use of single or multiple heat transfer devices 106.

Second PCB 104 is coupled mechanical to first PCB 102 through the use of fasteners 120 and standoffs 122. Fasteners 120 are typically screws, but can be other types of fasteners such as rivets, hollow feedthroughs, connectors, or other fasteners. Standoffs 122 are typically unthreaded inserts with a height equal to the height of spacer 141. The fasteners 120 and standoffs 122 are located at mechanically and/or electrically desirable locations on first PCB 102. These locations are typically at the periphery of first PCB 102, but can be anywhere on first PCB 102.

Second PCB 104 has areas 124 that are designed to facilitate the transfer of heat from device 108, through heat transfer device 106, to a heat sink. Areas 124 comprise plated though holes (PTHs) 126, consisting of holes in board 104 with interior walls of plated copper or other high thermal conductive material. In addition, the region within the hole may be filled with metal or other thermal transfer devices or mechanisms to enhance thermal conduction between the material 106 and the heatsink 130. Areas 124 can be designed to be the same size, a larger size, or a smaller size than the device 108, depending on the heat dissipation requirements for device 108 and the size of second PCB 104. An additional benefit of PTHs 126 is to provide a means of reducing air pockets in material 106 and to provide a volume where excesses of material 106 may flow in the case of a reduced gap between device 108 and board 104. Still another benefit of PTHs 126 can be to adjust the thermal conductivity of the paths of devices 108 and 132 to the common "isothermal" lateral heat spreader block 146 such that if the two devices have differing heat flow then the conductivity in each path can be adjusted such that the junction temperature of each device will be the same. This can be beneficial in improving timing margins of digital devices.

Thermal interface 128 is coupled to second PCB 104 to equalize and transfer heat from device 108, through heat transfer device 106 and second PCB 104 area 124 to lateral heat spreader block 146. Heat spreader block 146 is desirably of a thermally high conductivity material such as aluminum which allows the heat emanating from devices 108 and 132 to flow to heat sink 130 which is located outside of the volume used by boards 102 and 104. Additionally, heat spreader block 146 may incorporate imbedded heat pipes to enhance lateral thermal conduction and/or reduce height. Although shown as a finned heat sink, heatsink 130 can be any device, e.g., a heat pipe, that can conduct heat out of the heat spreader block 146. Thermal interface 128 can be electrically conductive, or non-electrically conductive, depending on the design for second PCB 104. For example, if devices 108–116 need to be mounted on second PCB 104, thermal interface 128 should be electrically non-conductive so as not to interfere with signals travelling between devices 108–116 that are mounted on second PCB 104. Thermal interface 128 can be thermal epoxy or any other material which thermally and mechanically bonds board 104 to heatsink 130 and between heatsink 130 and heat spreader block 146.

As opposed to FIG. 1A, heatsink 130 is now shown as being mounted outboard the volume occupied by PCB 102 and second PCB 104. This flexibility of the present invention to mount the heatsink 130 at multiple locations provides additional design capabilities, i.e., the height of assembly 100 is now independent of the height of heatsink 130. Thus, heat dissipative capability is provided without additional volume requirements for assembly 100 other than the height of heat spreader block 146.

FIG. 4B illustrates the assembly 100 as a completed assembly. The thermal coupling of device 108, heat transfer device 106, second PCB 104, thermal interface 128, heat spreader block 146 and heatsink 130 provide a thermal path for heat generated by device 108 to be dissipated by heatsink 130. Further, airflow can be provided to further cool device 108 and devices 114–116. Heatsink 130 can be larger or smaller than the height of PCB 102, PCB 104 and heat spreader block 146. Heat spreader block 146 also acts as a mechanical stabilizer for assembly 100, to provide additional mechanical stability for assemblies 100 that will experience more severe mechanical environments, e.g., vibration.

FIG. 4C illustrates assembly 100 in an isometric view. Heatsink 130 is shown as residing outboard of first PCB 102 and second PCB 104. Thermal interface 128 is shown on the opposite side of second PCB 104, and is shown as smaller than second PCB 104 to illustrate the flexibility of the design of the present invention. Airflow can again be provided to increase the heat dissipation capabilities of assembly 100.

The design of FIGS. 4A–4C can be used where assembly 100 height is at a premium, or, where the heatsink 130 would be more efficient located outboard first PCB 102 and second PCB 104 than it would be if heatsink 130 sat atop second PCB 104. This might occur when it is desirous to locate assembly 100 adjacent to similar assemblies 100 as close as practical to minimize electrical interconnect lengths, where airflow over the top of second PCB 104 is less than airflow outboard of assembly 100. Further, the placement of heatsink 130 outboard first PCB 102 and second PCB 104 allows heatsink 130 to be electrically grounded, or placed at a desired potential, using both first PCB 102 and second PCB 104.

Thermal Considerations

Figure 5A:
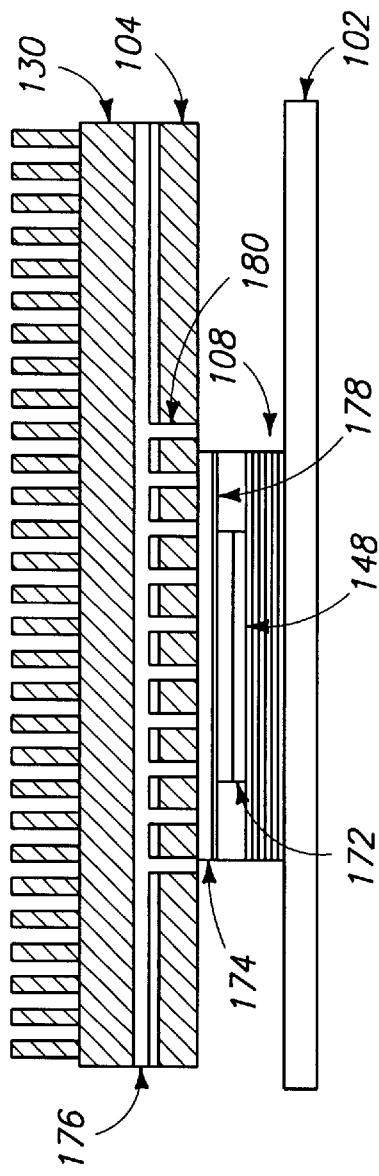
FIGS. 5A and 5B illustrate the thermal considerations of a printed circuit board embodying the present invention.
Figure 5B:
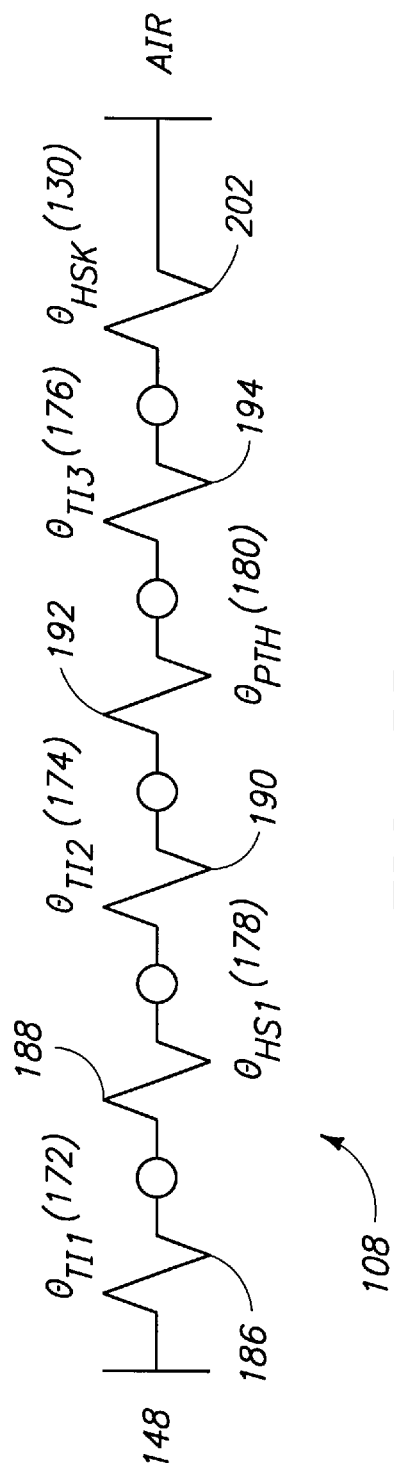

FIGS. 5A and 5B illustrate the thermal considerations of a printed circuit board embodying the present invention.

FIG. 5A illustrates assembly 100 with the various thermal interfaces described for the present invention. The silicon die is represented as die 148. Thermal Interface 1 (TI1) 172 is the thermal interface internal to the device 108 between device heatspreader 178 and silicon die 148. Heatspreader 178 may not always be present in which case thermal interface 172 would be used to represent the thermal resistance of the outside package surface to the silicon die 148, e.g. molding compound. Thermal Interface 2 (TI2) 174 is the interface between second PCB 104 and device 108. Thermal Interface 3 (TI3) 176 is the interface between second PCB 104 and heatsink 130.

Plated through holes (PTH) 180 is the area 124 of PCB 104 that allows thermal conduction through the board 104. Heatsink (HSK) 130 is the device that couples the heat flow to the air or in some cases to thermal pipes to remote radiators. FIG. 5B illustrates the thermal schematic for the assembly 100 shown in FIG. 5A. Starting from die 148, TI1 172 receives a thermal resistance value, theta TI1 ($\theta_{TI1}$) 186, HS1 178 receives a thermal resistance value theta HS1 ($\theta_{HS1}$) 188, TI2 174 receives a thermal resistance value, theta TI2 ($\theta_{TI2}$) 190, HV 180 receives a thermal resistance value, theta HV ($\theta_{HV}$) 192, TI3 176 receives a thermal resistance value, theta TI3 ($\theta_{TI3}$) 194, and HSK 130 receives a thermal resistance value, theta HSK ($\theta_{HSK}$) 202. The thermal resistances of the assembly 100 are determined in terms of degrees centigrade per watt (° C./W). To determine the total temperature rise across the interface from silicon die 148 to ambient air, the total power of the device is multiplied by the total thermal resistance:

$$\Delta T = \sum_{i=1}^{n} \theta i * W$$

For example, a 1° C./W total thermal resistance for a 50 Watt device would yield a total temperature change of 50° C.

Figure 6:
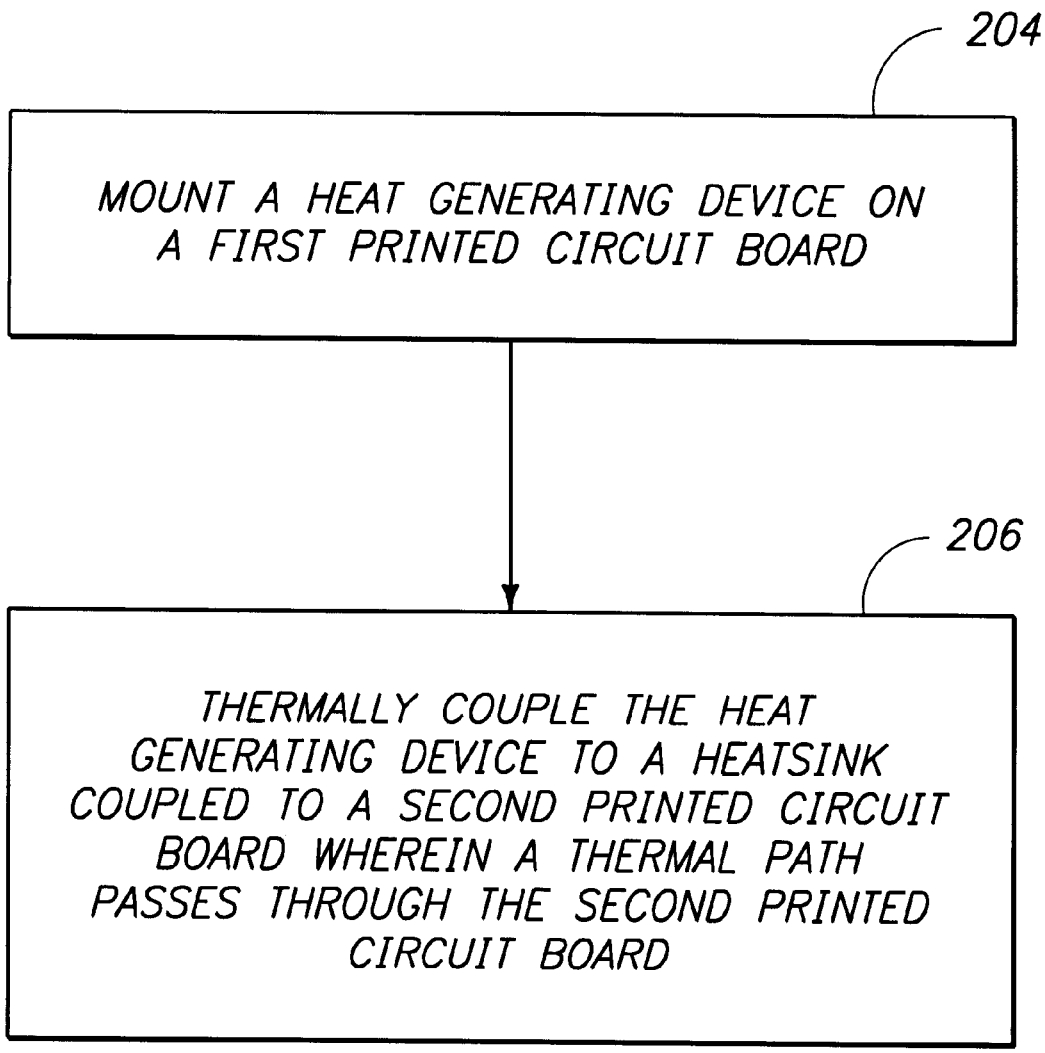
FIG. 6 illustrates a flow chart describing the steps used in practicing the present invention.

FIG. 6 illustrates a flow chart describing the steps used in practicing the present invention.

Block 204 represents the step of mounting a heat generating device on a first printed circuit board.

Block 206 represents the step of thermal coupling the heat generating device to a heatsink coupled to a second printed circuit board, wherein a thermal path passes through the second printed circuit board.

CONCLUSION

This concludes the description of the preferred embodiment of the invention. The following describes some alternative embodiments for accomplishing the present invention. Assembly 100 can have both rigid and flexible layers to accommodate the needs of PCB designers without departing from the scope of the present invention. Further, the thicknesses of assembly 100 can be modified to accommodate components as needed.

Although described with respect to thermal considerations, the present invention can also be used to shield device 108 from outside radiative effects, e.g., radiation, electromagnetic interference, etc. Further, device 108 can be shielded from emitting radiation and/or electromagnetic signals to the outside world through the use of the present invention. The present invention can also be used to provide power to devices through the second PCB 104 by contacting the device 108 through spacers 124 or standoffs 122.

In summary, the present invention discloses an encapuslated circuit assembly and a method for making such an assembly. The assembly comprises a first printed circuit board, a second printed circuit board, and a heat transfer device. The second printed circuit board comprises a heatsink, and the heat transfer device couples between a device mounted on the first printed circuit board and the second printed circuit board for transferring heat from the device to the heatsink of the second printed circuit board.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A circuit board assembly, comprising:
   a first circuit board;
   a second circuit board, coupled to the first circuit board, wherein at least a portion of the second circuit board is thermally coupled to a heatsink and wherein the second circuit board further comprises an area designed to transfer heat from a device mounted on the first circuit board to the heatsink; and
   a heat transfer device, thermally coupled between the device mounted on the first circuit board and the second circuit board, for transferring heat from the device to the heatsink.

2. The circuit board assembly of claim 1, further comprising a thermal interface, coupled between the heat transfer device and the second circuit board, for providing a larger contact area to the heatsink.

3. The circuit board assembly of claim 1, wherein the heatsink is selected from a group comprising a finned heat sink, a heat pipe, and a metallic layer.

4. The circuit board assembly of claim 1, wherein the heat transfer device is selected from a group comprising thermal grease, thermal epoxy, and metal.

5. The circuit board assembly of claim 1, wherein the second circuit board includes at least one device electrically coupled to the second circuit board.

6. The circuit board assembly of claim 1, wherein the device is mounted to the first circuit board using a ball grid array.

7. The circuit board assembly of claim 1, wherein multiple devices are thermally coupled to the second circuit board.

8. The circuit board assembly of claim 1, wherein the heatsink is situated outboard both the first circuit board and the second circuit board using a lateral heat spreader block.

9. The circuit board assembly of claim 1, further comprising a spacer, wherein the spacer substantially surrounds the device.

10. The circuit board assembly of claim 9, wherein the spacer comprises metal spacers for providing electrical conduction between the first circuit board and the second circuit board.

11. The circuit board assembly of claim 1, wherein a spacer is mounted between the first circuit board and the second circuit board.

12. The circuit board assembly of claim 1, wherein the area of the second circuit board includes at least one plated through hole.

13. The circuit board assembly of claim 1, wherein:
    the area of the second circuit board comprises a first plated through hole thermally coupled to a first device and the heat sink;
    the area of the second circuit board comprises a second plated through hole thermally coupled to a second device and the heat sink; and
    the first plated through hole and the second plated through hole substantially equalize temperatures between the first device and the second device.

14. The circuit board assembly of claim 1, wherein the heat transfer device has a variable height to accommodate a first device having a first height and a second device having a second height.

* * * * *